(12) United States Patent
Kumar et al.

(10) Patent No.: US 8,981,817 B2
(45) Date of Patent: Mar. 17, 2015

(54) OPERATING CONDITIONS COMPENSATION CIRCUIT

(71) Applicants: STMicroelectronics International N.V., Amsterdam (NL); STMicroelectronics (Crolles 2) SAS, Crolles (FR)

(72) Inventors: Vinod Kumar, Pratapgarh (IN); Pradeep Kumar Badrathwal, Greater Noida (IN); Saiyid Mohammad Irshad Rizvi, New Delhi (IN); Paras Garg, Noida (IN); Kallol Chatterjee, Kolkata (IN); Pierre Dautriche, Montbonnot (FR)

(73) Assignees: STMicroelectronics International N.V., Amsterdam (NL); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/926,748

(22) Filed: Jun. 25, 2013

(65) Prior Publication Data
US 2014/0375357 A1 Dec. 25, 2014

(51) Int. Cl.
*H03K 3/00* (2006.01)

(52) U.S. Cl.
USPC .............. 327/108; 327/112; 327/378; 326/87

(58) Field of Classification Search
USPC .............................. 327/108, 112, 378; 326/87
See application file for complete search history.

(56) References Cited

U.S. PATENT DOCUMENTS 6,980,020 B2 * 12/2005 Best et al. ........................ 326/30
7,586,325 B1 * 9/2009 Andrews et al. ................ 326/32

* cited by examiner

*Primary Examiner* — Kenneth B. Wells
(74) *Attorney, Agent, or Firm* — Gardere Wynne Sewell LLP

(57) ABSTRACT

A circuit having a centralized PT compensation circuit to provide compensation signals to localized I/O blocks on the chip. Process variations and temperature variations tend to be approximately uniform across an integrated circuit chip. Thus, a single, centralized PT compensation circuit may be used instead of one PT compensation circuit per I/O section as with solutions of the past. Further, the PT compensation circuit may generate a digital code indicative of the effects of process and temperature. Further yet, each section of I/O block may have a local voltage compensation circuit to compensate the voltage variation of the I/O block. The voltage compensation circuit utilizes an independent reference voltage. The reference voltage is generated by the PT compensation circuit, which is placed centrally in the IC chip and hence any need to repeat the reference generation for each I/O block is eliminated.

24 Claims, 4 Drawing Sheets

OPERATING CONDITIONS COMPENSATION CIRCUIT

BACKGROUND

Integrated circuits and processors typically operate within specific expected operating conditions, such as process, voltage and temperature (often shortened to PVT). As circuits operate in smaller and smaller contained environments, process and temperature (often shortened to PT as used herein) variations may begin to affect the operation of various electronic components. For example, input/output blocks may operate with specific range of expected characteristics (e.g., slew rate, rise time, fall time, and maximum drive current). As is known, these drive characteristics change significantly with variations in process and temperature parameters from the designed—for values of these parameters. Furthermore, the voltage supply sources may provide degraded supply voltage as operating conditions become more strained which will further increase the spread (degraded) of the characteristics of input/output blocks.

The effects of various changes in operating conditions, however, may be known across the variations of different operating parameters. Thus, changes in operating parameters may be compensated by knowing the specific operating conditions. Thus, typical circuits may often include temperature sensors, process sensors and other operating condition sensing circuitry or combined PVT sensing circuitry for providing compensation to drive characteristics of I/O blocks. However, this circuitry is typically large (with respect to the overall area of the integrated circuit die) and takes away precious space from actual functionality of the integrated circuit—especially when there are multiple voltage supply sections for the I/O blocks. Therefore, a need arises for keeping any operating condition compensation circuitry to a minimum with respect to actual die space as well as power consumption.

BRIEF DESCRIPTION OF THE DRAWINGS

The foregoing aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, an embodiment as described herein provides for a circuit that provides a centralized PT compensation circuit to provide compensation signals to localized I/O sections on the chip. This is because process variations and temperature variations tend to be approximately uniform across the integrated circuit chip. Thus, a single, centralized PT compensation circuit may be used instead of one PT compensation circuit per I/O section as with solutions of the past. Such a centralization of circuitry saves IC chip area and IC power.

Further, the PT compensation circuit may generate a digital code indicative of the effects of process and temperature. Such a digital code may be a small number of bits that may be routed to the I/O blocks via a serial bus (e.g., two or three wires) instead of a parallel bus which consumes greater IC chip space. This reduces routing complexity, and the size of the serial bus need not increase even if the digital code lengths increase. To accomplish this, the PT compensation circuit includes a parallel-to-serial converter, and each I/O section, likewise, includes a serial-to-parallel converter.

Further yet, each section of I/O block may have a local voltage compensation circuit to compensate the voltage variation of the I/O block. The voltage compensation circuit utilizes an independent reference voltage. The reference voltage is generated by the PT compensation circuit, which is placed centrally in the IC chip and hence any need to repeat the reference generation for each I/O block is eliminated. This also helps in reducing the needed area of the IC chip as well as the effective power consumption of the voltage compensation cell. These and other aspects of the integrated circuit chip are discussed in greater detail below with respect to FIGS. 1-8.

Figure 1:
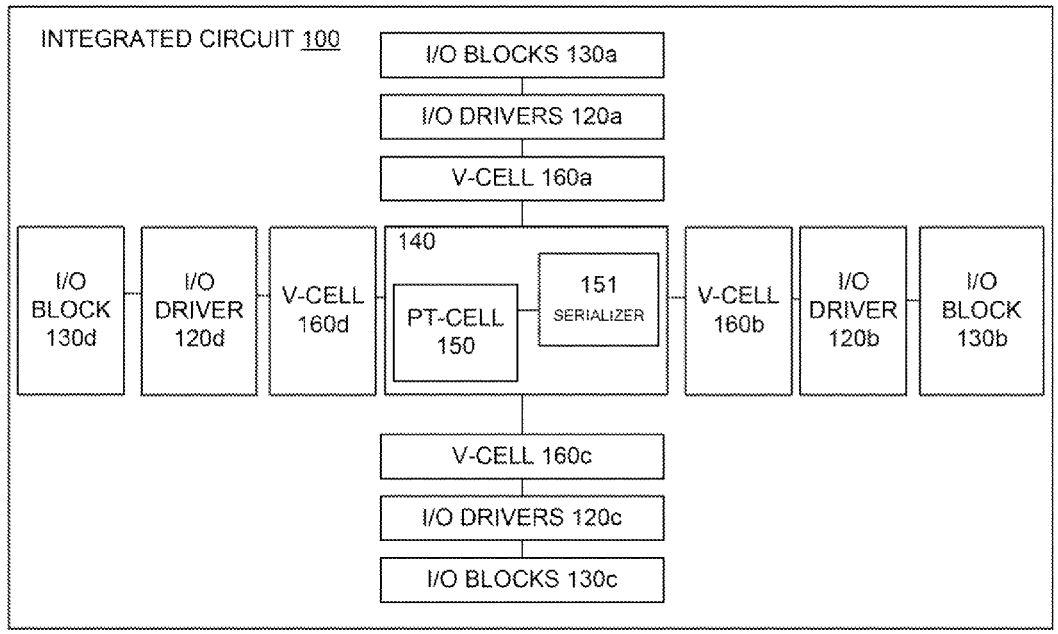
FIG. 1 shows a block diagram of an integrated circuit die having an operating condition compensation circuit disposed therein according to an embodiment of the subject matter discussed herein.

FIG. 1 shows a block diagram of an integrated circuit die 100 having an operating-condition compensation circuit 140 disposed therein according to an embodiment of the subject matter discussed herein. In this embodiment, the IC 100 includes a centralized operating-condition compensation circuit 140 that includes a process and temperature variation-sensing circuit 150 (PT-cell 150 hereinafter) as well as a centralized distribution of a reference voltage used to generate localized voltage compensation signals at various I/O sections 130a-d. Further, each I/O section 130a-d is associated with a number of localized I/O drivers 120a-d and a localized voltage compensation circuit 160a-d (V-Cell 160a-d hereinafter). In FIG. 1, the centralized reference voltage is not shown in detail, but each I/O section 130a-d receives both a digital PT compensation signal from the centralized PT-cell 150 as well as digital compensation signal from a localized V-cells 160a-d. The digital PT compensation signal generated by the PT-cell 150 may be sent through a serializer 151 that is part of the operating-condition compensation circuit 140 so as to change the digital PT compensation signal into a serial stream of bits. Then the serial data stream may be more easily distributed to each I/O section 130a-d. Although not shown, each I/O section 130a-d may include a de-serializer circuit for reassembling the digital PT compensation signal for local use. The PT-cell 150 is described in greater detail below with respect to FIG. 2. The localized V-Cells 160a-d are described in greater detail below with respect to FIG. 3. The I/O drivers 120a-d are described in greater detail below with respect to FIG. 8.

Figure 2:
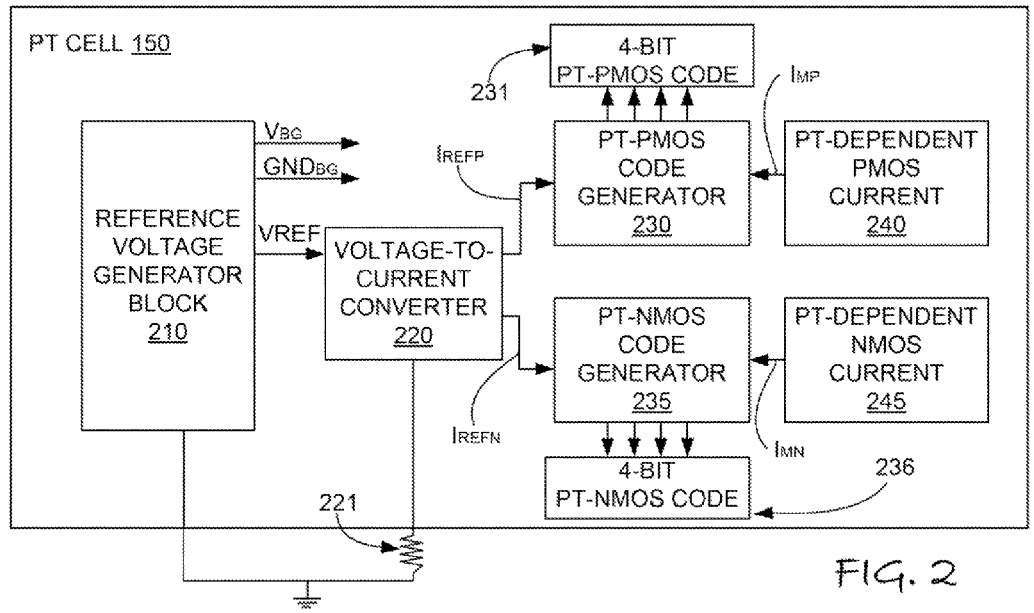
FIG. 2 shows a block diagram of a process and temperature compensation circuit that may be part of the integrated circuit of FIG. 1 according to an embodiment of the subject matter discussed herein.

FIG. 2 shows a block diagram of a PT-cell 150 that may be part of the integrated circuit 100 of FIG. 1 according to an embodiment of the subject matter discussed herein. In this embodiment, a centralized PT-cell 150 may generate compensation codes for use in localized I/O blocks (as shown in FIG. 1) that are dependent upon variables such as process variations in the circuitry and performance variables due to temperature fluctuations. In general then, this PT-cell 150 is able to compare an independent reference current to a PT-dependent current for both PMOS and NMOS transistors. The comparison then results in a determination of compensation needed. To accomplish this, the independent and PT-dependent currents are generated with circuitry in the PT-cell 150.

Initially focusing on the left-hand side of FIG. 2, the independent currents $I_{REFP}$ and $I_{REFN}$ are generated. To do so, a reference-voltage-generator block 210 generates a first reference voltage $V_{REF}$. The reference-voltage-generator block 210 also generates a second reference voltage $V_{BG}$ (in this embodiment, BG stands for "bandgap"), and a ground $GND_{BG}$ to which the second reference voltage $V_{BG}$ is referenced. As is discussed further below with respect to FIG. 6, $V_{BG}$ and $GND_{BG}$ are coupled to each voltage-compensation cell 160a-d. The absolute voltage values of $V_{BG}$ and $V_{REF}$ of the PT compensation cell 150 may or may not be the same. However, $V_{REF}$ is measured with respect to the local ground of the PT compensation cell 150 and $V_{BG}$ is measured with reference to the bandgap reference ground $GND_{BG}$.

Having a local voltage reference (first reference voltage $V_{REF}$), a voltage-to-current converter 220 may convert $V_{REF}$ into the two afore-mentioned independent reference currents $I_{REFN}$ and $I_{REFP}$ using an external resistor 221. The external resistor 221 may have a precision value and may be temperature compensated. The voltage-to-current generator 220 is described in further detail below with respect to FIG. 3.

Turning attention to the right-had side of the PT-cell 150 shown in FIG. 2, two PT-dependent currents $I_{MP}$ and $I_{MN}$ are also generated by a PT-dependent PMOS current generator 240 and a PT-dependent NMOS current generator 245, respectively. The PT-dependent PMOS current generator 240 generates a current $I_{MP}$ with one or more PMOS transistors such that $I_{MP}$ is dependent both on process parameters and temperature as they affect PMOS transistors within the integrated circuit. Similarly, PT-dependent NMOS current generator 245 generates a current $I_{MN}$ with one or more NMOS transistors such that $I_{MN}$ is dependent both on process parameters and temperature as they affect NMOS transistors within the integrated circuit. With the two independent reference currents $I_{REFN}$ and $I_{REFP}$ and the two PT-dependent reference currents $I_{MP}$ and $I_{MN}$, compensation signals for PMOS and NMOS drive stages of I/O drive sections may be generated.

A PMOS compensation signal generator 230 compares $I_{REFP}$ to $I_{MP}$, and, in response to the difference between $I_{REFP}$ and $I_{MP}$, generates a digital compensation signal (e.g., a 4-bit code in this embodiment) that represents the level of compensation that needs to be provided to the PMOS drive stages (as discussed further with respect to FIG. 8 below) in the I/O drive sections. For example, if $I_{REFP}=I_{MP}$, then the compensation signal may be zero, or at some other typical value corresponding to $I_{REFP}=I_{MP}$, which indicates no compensation is to be provided to the PMOS drive stages. If $I_{REFP}>I_{MP}$, then the compensation signal may have a positive value that compensates the PMOS drive stages of the I/O drive sections such that the overall drive strength is higher. Likewise, if $I_{REFP}<I_{MP}$, then the compensation signal may have a negative value that compensates the PMOS drive stages of the I/O drive sections such that a lower drive strength is realized. The specific nature of the generation of the PT-PMOS compensation signal is discussed in greater detail below with respect to FIG. 4.

Further, an NMOS compensation signal generator 235 compares $I_{REFN}$ to $I_{MN}$ and, in response to the difference between $I_{REFN}$ and $I_{MN}$, generates a digital compensation signal (e.g., a 4-bit code) that represents the level of compensation that is to be provided to the NMOS drive stages in the I/O drive sections. Similar to above with respect to the PMOS situation, if $I_{REFN}=I_{MN}$, then the compensation signal may be zero or at some other typical value corresponding to $I_{REFN}=I_{MN}$, which indicates no compensation is to be provided to the NMOS drive stages. If $I_{REFN}>I_{MN}$, then the compensation signal may have a positive value that compensates the NMOS drive stages of the I/O drive sections to yield a higher drive strength. And if $I_{REFN}<I_{MN}$, then the compensation signal may have a negative value that compensates the NMOS drive stages of the I/O drive sections to yield a lower drive strength. The specific nature of the generation of the PT-NMOS compensation signal is discussed in greater detail below with respect to FIG. 5.

Figure 3:
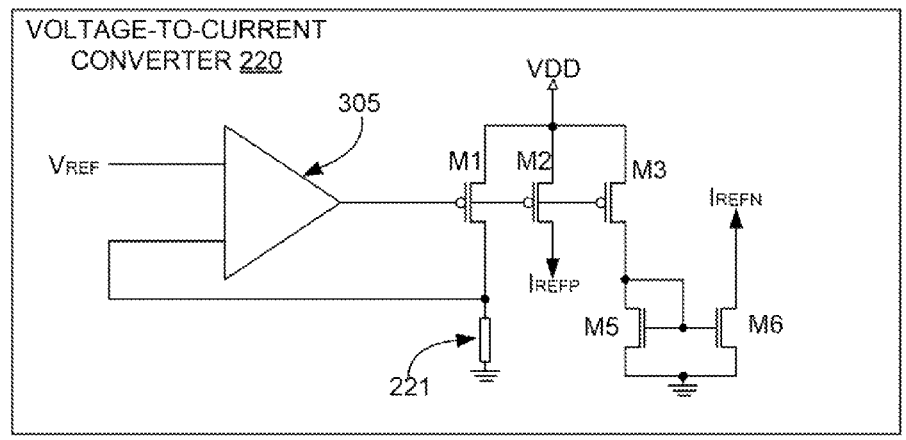
FIG. 3 shows a block diagram of a voltage-to-current converter circuit that may be part of the integrated circuit of FIG. 1 according to an embodiment of the subject matter discussed herein.

FIG. 3 shows a block diagram of a voltage-to-current converter circuit 220 that may be part of the PT-compensation circuit 150 of FIG. 2 according to an embodiment of the subject matter discussed herein. In this circuit 220, a reference voltage $V_{REF}$ is used to generate two reference currents that are independent of any PT variations as discussed above. The reference voltage $V_{REF}$ is coupled to a first input node of an amplifier 305. The second input of the amplifier 305 is coupled to an external resistor 221 suited to bias the amplifier to hold the amplifier output steady. The output of the amplifier is coupled to a gate node of a first PMOS transistor M1. Further, the drain node of the first PMOS transistor M1 is also coupled to the second input of the amplifier 305. With the source node of the first PMOS transistor coupled to a voltage supply $V_{DD}$, a steady current is drawn through the first PMOS transistor M1 and held by the feedback though the amplifier 305.

This current is mirrored on the second and third PMOS transistors M2 and M3, respectively. Further, the source nodes of these PMOS transistors M2 and M3 are also coupled to the voltage supply $V_{DD}$. The drain of the second PMOS transistor M2 is then used as a current source for the PMOS current reference $I_{REFP}$. Further, the drain of the third PMOS transistor is coupled to a drain node of the first NMOS transistor M5 which is in turn coupled to the gate nodes of each of the first and second NMOS transistors M5 and M6. This coupling holds the node between the drain of the third PMOS transistor M3 and the drain of the first NMOS transistor M5 at a steady voltage related to the reference voltage $V_{REF}$. Thus, the current through the first NMOS transistor M5 is mirrored at the second NMOS transistor M6, thereby creating an NMOS reference current $I_{REFN}$. As previously stated, these two reference currents $I_{REFN}$ and $I_{REFP}$ are generated independent of any PT variables because of the use of an external resistor 221.

Figure 4:
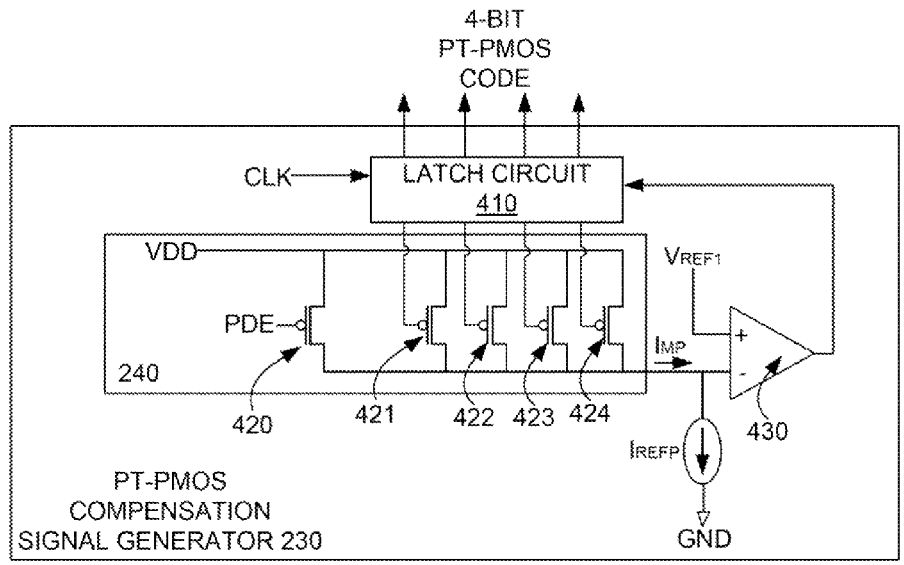
FIG. 4 shows a block diagram of a process and temperature PMOS compensation signal generation circuit that may be part of the process and temperature compensation circuit of FIG. 2 according to an embodiment of the subject matter discussed herein.

FIG. 4 shows a block diagram of a PT-PMOS compensation signal generation circuit 230 that may be part of the PT compensation circuit 150 of FIG. 2 according to an embodiment of the subject matter discussed herein. FIG. 4 also shows some details with regard to the PT-dependent reference signal generation circuit 240 of FIG. 2 as well. In this embodiment, the PT-PMOS compensation signal generation circuit 230 uses the independent reference current $I_{REFP}$ (which was generated independent of any effects of process and temperature) and the PT-dependent PMOS current $I_{MP}$ (which is generated with respect to effects from process and temperature variations). As can be seen in FIG. 4, the PT-dependent PMOS current $I_{MP}$ is drawn from a group of parallel-connected PMOS transistors 420-424. The first 420 of these PMOS transistors has a gate coupled to a PMOS-enable signal PDE such that this transistor is turned on anytime a global PMOS-enable signal PDE is set. The other four transistors 421-424 (four are shown in this embodiment, but a different number may be used corresponding to a different bit-value for the PT compensation signal) have gates coupled to respective logic circuits within a binary-weighted latch circuit 410. Further, the binary-weighted latch circuit 410 may be clocked by a local or global clock signal CLK.

In operation, an initial state without any compensation signal being generated will result in a PT-dependent current signal $I_{MP}$ being equal to the independent reference current $I_{REFP}$. Thus, the entire PT-dependent current $I_{MP}$ is sunk through the reference current $I_{REFP}$. Therefore, the voltage at the negative input node of the comparator 430 will be equal to a suitable reference voltage $V_{REF1}$. With the voltages at the inputs of the comparator 430 being equal, there is no compensation signal to be generated. This is intuitive as this corresponds to initial conditions with respect to process and temperature. As process and temperature variations develop, the PT-dependent current $I_{MP}$ will begin to fluctuate. Thus, as the voltage at the negative input of the comparator 430, in turn, fluctuates, logic blocks within the binary-weighted latch circuit 410 begin to change. Based on the difference then between the voltage at the negative input of the comparator 430 and the reference voltage $V_{REF1}$, (which corresponds to the difference between the independent reference current $I_{REFP}$ and the PT-dependent current $I_{MP}$), the binary-weighted latch circuit 410 generates a four-bit binary code representative of the magnitude of the difference. Any number of digital control schemas may be used, such as a four-bit binary value of 0000 corresponding to a zero-level compensation signal. However, in other embodiments, since the compensation signal may be positive or negative, a binary value of 0100 may correspond to the zero-level compensation signal such that higher binary numbers represent a positive compensation signal and lower binary numbers represent negative compensation signals. Thus, the PMOS compensation signal generated may be a four-bit binary weighted code corresponding to a level of compensation to be implemented at localized I/O drive blocks because of PT variations. Such a compensation signal may be communicated via a serial or parallel bus. Using a serial bus may provide an advantage of lowering the number to signal traces to outer regions of the integrated circuit (e.g., where the I/O drive blocks are). With a serial bus, the PT-PMOS compensation signal generator may also include parallel-to-serial converter circuitry 231 as shown in FIG. 2 and corresponding serial-to-parallel conversion circuitry at the remote location of the I/O drive blocks as well (although not shown in detail).

Figure 5:
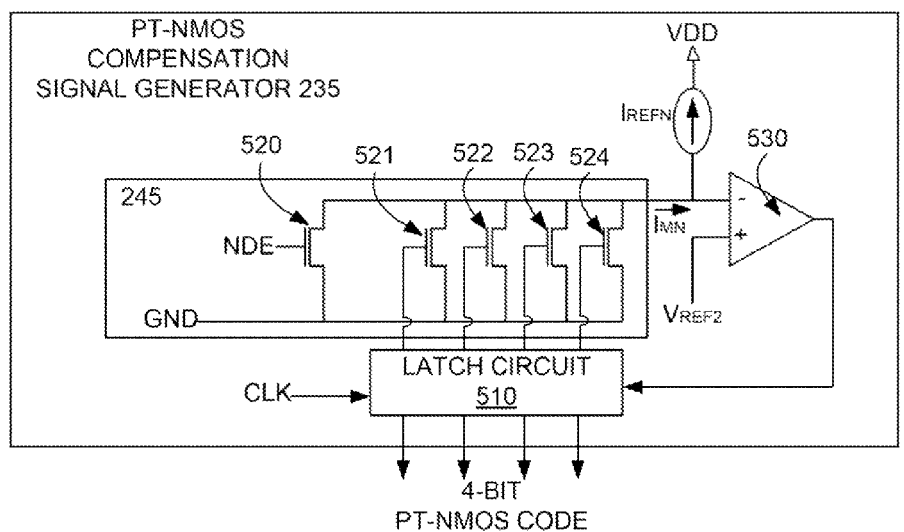
FIG. 5 shows a block diagram of a process and temperature NMOS compensation signal generation circuit that may be part of the process and temperature compensation circuit of FIG. 2 according to an embodiment of the subject matter discussed herein.

FIG. 5 shows a block diagram of a PT-NMOS signal generation circuit 235 that may be part of the PT compensation circuit 150 of FIG. 2 according to an embodiment of the subject matter discussed herein. FIG. 5 also shows some details with regard to the PT-dependent reference signal generation circuit 245 (for NMOS) of FIG. 2 as well. In this embodiment, the PT-NMOS compensation signal generation circuit 235 uses the independent reference current $I_{REFN}$ (which was generated independent of any effects of process and temperature) and the PT-dependent NMOS current $I_{MN}$ (which is generated with respect to effects from process and temperature variations). As can be seen in FIG. 5, the PT-dependent NMOS current $I_{MN}$ is drawn from a group of parallel-connected NMOS transistors 520-524. The first 520 of these NMOS transistors has a gate coupled to a NMOS-enable signal NDE such that this transistor is turned on anytime a global NMOS-enable signal NDE is set. The other four transistors 521-524 (four are shown in this embodiment, but a different number may be used corresponding to a different bit-value for the PT compensation signal) have gates coupled to respective logic circuits within a binary-weighted latch circuit 510. Further, the binary-weighted latch circuit 510 may be clocked by a local or global clock signal CLK.

In operation, an initial state without any compensation signal being generated will result in a PT-dependent current signal $I_{MN}$ being equal to the independent reference current $I_{REFN}$. Thus, the entire PT-dependent current $I_{MN}$ is sunk through the reference current $I_{REFN}$. Therefore, the voltage at the negative input node of the comparator 530 will be equal to a suitable reference voltage $V_{REF2}$. With the voltages at the inputs of the comparator 530 being equal, there is no compensation signal to be generated. This is intuitive as this corresponds to initial conditions with respect to process and temperature. As process and temperature variations develop, the PT-dependent current $I_{MN}$ will begin to fluctuate. Thus, as the voltage at the negative input of the comparator 530, in turn, fluctuates, logic blocks within the binary-weighted latch circuit 510 begin to change. Based on the difference then between the voltage at the negative input of the comparator 530 and the reference voltage $V_{REF2}$, (which corresponds to the difference between the independent reference current $I_{REFN}$ and the PT-dependent current $I_{MN}$), the binary-weighted latch circuit 510 generates a four-bit binary code representative of the magnitude of the difference. Thus, the NMOS compensation signal generated may be a four-bit binary weighted code corresponding to a level of compensation to be implemented at localized I/O drive blocks because of PT variations.

Figure 6:
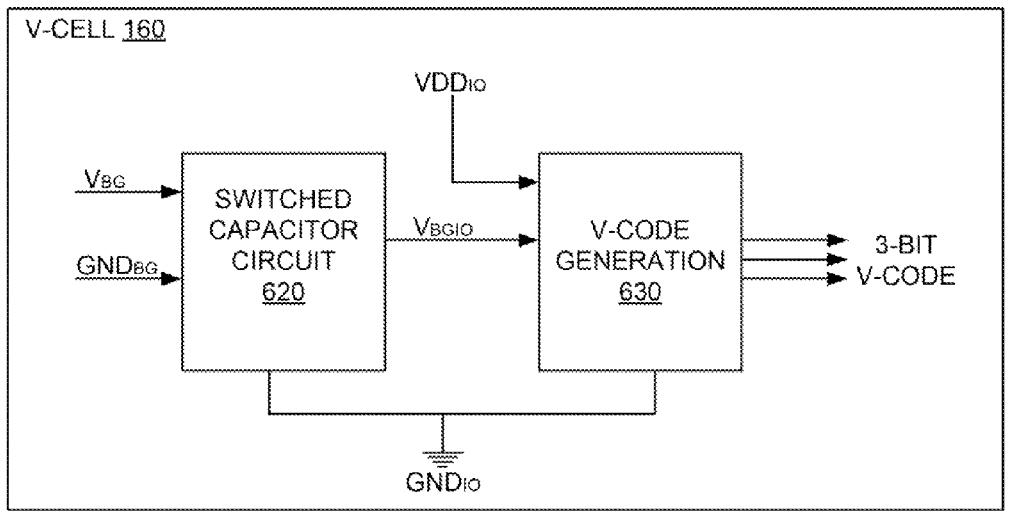
FIG. 6 shows a block diagram of a voltage compensation circuit that may be part of the integrated circuit of FIG. 1 according to an embodiment of the subject matter discussed herein.

In addition to the compensation signals described above with respect to FIG. 2-5 corresponding to PT variables in the integrated circuit, voltage variations across the integrated circuit may also be taken into account. Thus, FIG. 6 shows a block diagram of a voltage compensation signal generator 160 (V-cell) that may be part of the integrated circuit 100 of FIG. 1 according to an embodiment of the subject matter discussed herein. As shown in FIG. 1, there may be a v-cell 160 located at each I/O region in a localized manner. Thus, a first I/O block 130a may also have a corresponding V-cell 160a for generating a voltage compensation signal for influencing the local I/O driver 120a.

The V-cell 160 includes nodes for coupling to the bandgap voltage $V_{BG}$ node and bandgap ground $GND_{BG}$ node as discussed above with respect to the centralized PT compensation signal generation circuit 150 in FIG. 2. Thus, the V-cell 160 receives a differential voltage $V_{BG}$–$GND_{BG}$. Having a localized V-cell 160 provides for a circuit 100 to be configured to generate a local voltage compensation signal that compensates for voltage differences local to the various I/O regions. That is, local ground voltage (e.g., $GND_{IO}$ for example) may not be equivalent to a central ground (e.g., $GND_{BG}$ for example).

Because the localized ground voltage $GND_{IO}$ typically does not equal a centralized ground voltage $GND_{BG}$, the V-cell may generate a localized voltage differential $V_{BGIO}$ such that the differential voltage $V_{BGIO}$–$GND_{IO}$=$V_{BG}$–$GND_{BG}$. One way to generate the localized voltage differential $V_{BGIO}$ is via a switched capacitor circuit 620. This circuit is described in greater detail below with respect to FIG. 7.

A binary-code generator 630 within the V-cell 160 compares $V_{BGIO}$ and a localized voltage supply signal $VDD_{IO}$ (of course both $V_{BGIO}$ and $VDD_{IO}$ are referenced to a common node in localized ground $GND_{IO}$). Further, the signal $VDD_{IO}$ may be scaled by a scaling factor $\alpha$ so as to compare to $V_{BGIO}$. In response to the difference between $V_{BGIO}$ and $VDD_{IO}$, the binary-code generator 630 generates a digital compensation signal (e.g., a digital 3-bit code in this embodiment) that represents the levels of compensation that may to be provided to the PMOS and NMOS drive stages, respectively, in the localized I/O driver. For example, if $V_{BGIO}$=$\alpha \cdot VDD_{IO}$, then the compensation signal may be zero or at some other typical value, which indicates no compensation signal need be provided to the PMOS and NMOS drive stages with respect to voltage variations. If $V_{BGIO}$>$\alpha \cdot VDD_{IO}$, then the code may have a positive value that compensates the PMOS and NMOS drive stages of the I/O drivers such that higher drive strengths are realized. And if $V_{BGIO}$<$\alpha \cdot VDD_{IO}$, then the compensation signal may have a negative value that compensates the PMOS and NMOS drive stages of the I/O drivers such that lower drive strengths are realized.

Figure 7:
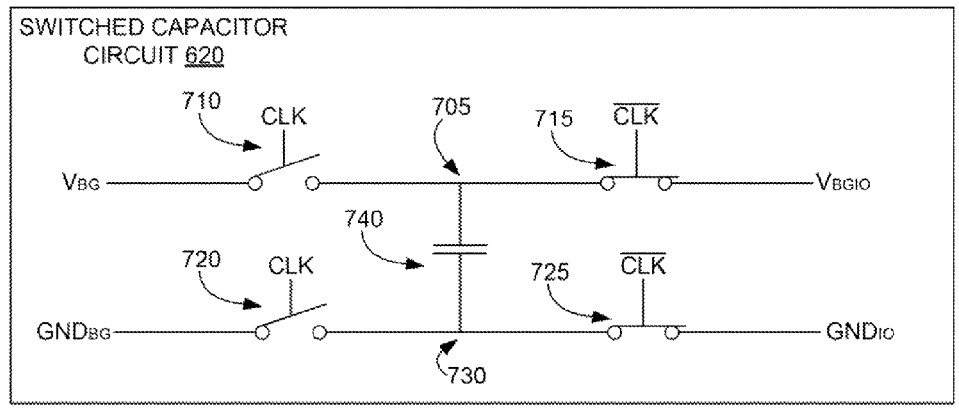
FIG. 7 shows a block diagram of a switched capacitor circuit that may be part of the voltage compensation circuit of FIG. 6 according to an embodiment of the subject matter discussed herein.

FIG. 7 shows a block diagram of a switched capacitor circuit 620 that may be part of the voltage compensation circuit of FIG. 6 according to an embodiment of the subject matter discussed herein. One circuit configured for this purpose includes use of a switched-capacitor circuit having a single capacitor 740 coupled to four switches. In this embodiment, the capacitor 740 is coupled between a first node 705 and a second node 730. A first switch 710, controlled by a rising edge of a clock signal CLK is coupled between the first node 705 and the input node for the bandgap voltage $V_{BG}$. A second switch 720, also controlled by a rising edge of a clock signal CLK is coupled between the second node 730 and the input node for the bandgap ground $GND_{BG}$. Similarly, two switches 715 and 725 are respectively coupled between the first node 705 and the localized bandgap voltage $V_{BGIO}$, and between the second node 730 and the localized bandgap ground $GND_{BGIO}$. The second pair of switches are controlled by the falling edge of the clock signal CLK.

In operation, the circuit switches couplings that push and pull charges into and out of capacitor when the various switches are opened and closed, respectively. As is the case with the reciprocal clock signals, non-overlapping signals are used to control the switches such that not all switches are closed simultaneously. This switched capacitor circuit 630 is suitable for use within integrated circuits, where accurately specified resistors and capacitors are not economical to construct. The resulting transfer function yields $V_{BGIO}$–$GND_{IO}$=$V_{BG}$–$GND_{BG}$ while maintaining electrical isolation of localized voltages and grounds from centralized voltages and grounds. However, any other circuit topology may be used insomuch as $V_{BGIO}$–$GND_{IO}$=$V_{BG}$–$GND_{BG}$.

Figure 8:
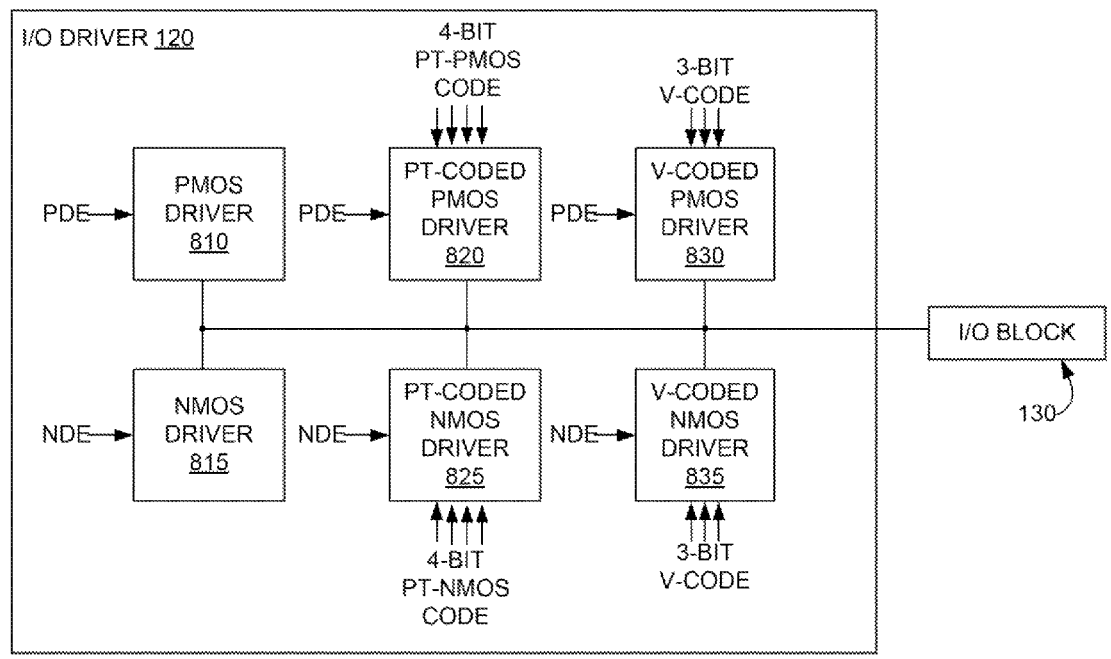
FIG. 8 shows a block diagram of input/output section circuit that may be part of the integrated circuit of FIG. 1 according to an embodiment of the subject matter discussed herein.

FIG. 8 shows a block diagram of I/O driver circuit 120 that may be part of the integrated circuit of FIG. 1 according to an embodiment of the subject matter discussed herein. The I/O driver circuit 120 may be coupled to at least one I/O block 130 configured to facilitate communication signals to and from the integrated circuit chip in a typical push-pull drive technique. The I/O driver circuit 120 provides signal conditioning for input signals and output signals associated with the coupled I/O block 130. Thus, the I/O driver 120 includes a first PMOS driver 810 and a first NMOS driver 815 that is always active (subject to the enable signals PDE and NDE per typical I/O driver operation). This portion is designed to provide the required drive strength at optimal conditions (e.g., when process is fast, voltage is at a maximum, and temperature is low). However, as the operating conditions move toward more difficult parameters (e.g., when process slows, voltage begins to droop, and temperature is higher), a first PMOS driver 810 and a first NMOS driver 815 are not able to provide the required drive strength. Thus, additional drive strength may be provided through compensation drivers, namely PT-PMOS compensation signal driver 820, PT-NMOS compensation signal driver 825, PMOS voltage compensation signal driver 830 and NMOS voltage compensation signal driver 835.

Looking at each compensation signal driver separately, one can see that the PT-PMOS compensation signal driver 820 is configured to provide a pull up drive strength that is controlled by the PT-PMOS compensation signal generated by the PT-PMOS signal generation circuit 230. For example, the PT-PMOS compensation signal driver 820 may have a number of PMOS transistors (e.g., 4 transistors for a 4-bit binary code but not shown in FIG. 8) in parallel that are each individually controllable by the PT-PMOS compensation signal. The more of these transistors that the PT-PMOS compensation signal enables, the higher the pull up drive strength compensation provided by PT-PMOS compensation signal driver 820 and, consequently, the higher the pull up drive strength of the I/O drive circuit 120 overall. Conversely, the fewer of these transistors that the PT-PMOS compensation signal enables, the lower the pull up drive strength contribution of the PT-PMOS compensation signal driver 820, and the lower the pull up drive strength of the I/O driver circuit 120.

Similarly, the PT-NMOS compensation signal driver 825 is configured to provide a pull-down drive strength that is controlled by the PT-NMOS compensation signal generated by the PT-NMOS signal generation circuit 235. For example, the PT-NMOS compensation signal driver 825 may have a number of NMOS transistors (e.g., 4 transistors for a 4-bit binary code but not shown in FIG. 8) in parallel that are each individually controllable by the PT-NMOS compensation signal. The more of these transistors that the PT-NMOS compensation signal enables, the higher the pull-down drive strength compensation provide by PT-NMOS compensation signal driver 825 and, consequently, the higher the pull-up drive strength of the I/O drive circuit 120 overall. Conversely, the fewer of these transistors that the PT-NMOS compensation signal enables, the lower the pull-down drive strength contribution of the PT-NMOS compensation signal driver 825, and the lower the pull-down drive strength of the I/O driver circuit 120.

Further, the PMOS voltage compensation signal driver 830 is configured to provide additional pull-up drive strength that is controlled by the local voltage compensation signal generated by the local voltage compensation signal generation circuit 160. For example, the PMOS voltage compensation signal driver 830 may have a number of PMOS transistors (e.g., 3 transistors for a 3-bit binary code but not shown in FIG. 8) in parallel that are each individually controllable by the local voltage compensation signal. The more of these transistors that the voltage compensation signal enables, the higher the pull-up drive strength compensation provided by PMOS voltage compensation signal driver 830 and, consequently, the higher the pull-up drive strength of the I/O drive circuit 120 overall. Conversely, the fewer of these transistors that the voltage compensation signal enables, the lower the pull-up drive strength contribution of the PMOS voltage compensation signal driver 830, and the lower the pull-up drive strength of the I/O driver circuit 120. Likewise, the NMOS voltage compensation signal driver 835 is also controlled by the local voltage compensation signal is a similar but opposite (pull-down) manner.

By way of non-limiting example and with reference back to FIG. 6, suppose that $VDD_{IO}$ is higher than "normal". This means that for a given gate drive voltage on each PMOS transistor of the I/O drive circuit 120, the magnitude of the gate-source voltage $V_{GS}$ for each PMOS transistor is higher, such that each PMOS transistor has a higher drive current, and, therefore, can pull up the output node to a desired voltage level faster. Therefore, this means that the voltage compensation signal enables fewer PMOS transistors in the PMOS voltage compensation signal driver 830. Similarly, this means that for a given gate drive voltage on each NMOS transistor of the I/O drive circuit 120, the magnitude of the gate-source voltage $V_{GS}$ for each NMOS transistor is also higher, such that each NMOS transistor has a higher drive current, and, therefore, can pull down the output node to a desired voltage level faster. Therefore, this means that the voltage compensation signal enables fewer NMOS transistors in the NMOS voltage compensation signal driver 835.

Conversely, suppose that $VDD_{IO}$ is lower than "normal". This means that for a given gate drive voltage on each PMOS transistor of the I/O drive circuit 120, the magnitude of the gate-source voltage $V_{GS}$ for each PMOS transistor is lower, such that each PMOS transistor has a lower drive current, and, therefore, pulls up the output node to a desired voltage level slower. Therefore, this means that the voltage compensation signal enables more PMOS transistors in the PMOS voltage compensation signal driver 830. Similarly, this means that for a given gate drive voltage on each NMOS transistor of the I/O drive circuit 120, the magnitude of the gate-source voltage $V_{GS}$ for each NMOS transistor is lower, such that each NMOS transistor has a lower drive current, and, therefore, pulls down the output node to a desired voltage level slower. Therefore, this means that the voltage compensation signal enables more NMOS transistors in the NMOS voltage compensation signal driver 835.

Figure 9:
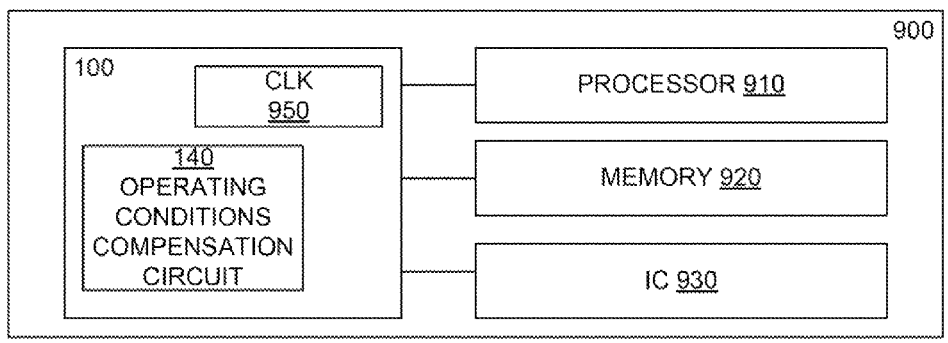
FIG. 9 shows a block diagram a system that may include the operating conditions compensation circuit of FIG. 1 according to an embodiment of the subject matter disclosed herein.

FIG. 9 shows a block diagram a system 900 that may include the operating conditions compensation circuit 140 of FIG. 1 according to an embodiment of the subject matter disclosed herein. The PT-cell 150 described above with respect to FIGS. 1-8 may be part of an overall system as well. FIG. 9 shows a block diagram of a system 900 that may include the compensation circuit 140 of FIG. 1 according to an embodiment of the subject matter disclosed herein. The compensation circuit 140 may be disposed on a single integrated circuit die 100 as shown, or may be disposed across more than one integrated circuit die such as a second integrated circuit die 930 that is shown as coupled to the first integrated circuit die 100.

Further yet, the system 900 may also include a processor 910 and a memory 920 coupled to the first integrated circuit die 100. These additional components may also be disposed on separate integrated circuit dies on the same integrated circuit die with the compensation circuit 140. These additional components may also employ use of the system clock 950.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. An input/output drive circuit, comprising:
   a first drive block configured to generate an input/output drive signal for driving an input/output node;
   a second drive block configured to alter the input/output drive signal in response to a localized voltage compensation signal generated as a function of a measured difference between a supply voltage for the input/output drive circuit and a fixed bandgap reference voltage;
   a third drive block configured to alter the input/output drive signal in response to a centralized operating condition compensation signal generated as a function of process and temperature variation.

2. The input/output drive circuit of claim 1, wherein the first drive block comprises:
   a PMOS driver coupled to a PMOS enable node; and
   an NMOS driver coupled to an NMOS enable node.

3. The input/output drive circuit of claim 1, wherein the third drive block comprises:
   a PMOS operating condition compensation block configured to receive a PMOS operating condition compensation code and to alter the input/output drive signal in response to the PMOS operating condition compensation code; and
   an NMOS operating condition compensation block configured to receive an NMOS operating condition compensation code and to alter the input/output drive signal in response to the NMOS operating condition compensation code.

4. The input/output drive circuit of claim 3, wherein the PMOS operating condition compensation code comprises a multi-bit digital code and the NMOS operating condition compensation code comprises a multi-bit digital code.

5. The input/output drive circuit of claim 1, wherein the second drive block comprises:
   a PMOS voltage compensation block configured to receive a PMOS voltage compensation code and to alter the input/output drive signal in response to the operating condition compensation code; and
   an NMOS voltage compensation block configured to receive an NMOS voltage compensation code and to alter the input/output drive signal in response to the operating condition compensation code.

6. The input/output drive circuit of claim 5, wherein the PMOS voltage compensation code comprises a multi-bit digital code and the NMOS voltage compensation code comprises a multi-bit digital code.

7. The input/output drive circuit of claim 1, further comprising:
   a reference signal generator configured to generate a reference signal unaffected by any operating condition corresponding to process and temperature variation;
   a compensation signal generator configured to generate a process and temperature variation dependent signal; and an operating condition code generator configured to generate the centralized operating condition compensation signal in response to a difference between the reference signal and the process and temperature variation dependent signal.

8. The input/output drive circuit of claim 7, further comprising a serializer circuit coupled to the operating condition code generator and configured to serialize a code signal comprising the centralized operating condition compensation signal.

9. The input/output drive circuit of claim 7 wherein the operating condition code generator comprises a PMOS code generator and an NMOS code generator.

10. The input/output drive circuit of claim 9 wherein the PMOS code generator and the NMOS code generator are configured to generate a four-bit code representative of an operating condition.

11. The input/output drive circuit of claim 7 wherein the compensation signal generator comprises a PMOS signal generator and an NMOS signal generator.

12. An integrated circuit, comprising:
an operating condition compensation circuit configured to generate a process and temperature variation digital compensation signal corresponding to at least one operating condition on the integrated circuit;
a localized voltage compensation circuit configured to generate a voltage variation digital compensation signal as a function of a measured difference between a supply voltage at a localized area of the integrated circuit and a fixed reference voltage; and
a localized input/output drive circuit configured to generate an input/output drive signal in response to the process and temperature variation digital compensation signal and the voltage variation digital compensation signal.

13. The integrated circuit of claim 12, further comprising a serial bus coupled to the localized input/output drive circuit and coupled to the operating condition compensation circuit, the serial bus configured to communicate the process and temperature variation digital compensation signal from the operating condition compensation circuit to the localized input/output drive circuit.

14. The integrated circuit of claim 12, further comprising a single integrated circuit die that includes the integrated circuit.

15. The integrated circuit of claim 12, further comprising multiple integrated circuit dies that includes the integrated circuit.

16. The integrated circuit of claim 12, further comprising:
a second localized voltage compensation circuit configured to generate a digital compensation signal corresponding to a voltage at a second localized area of the integrated circuit; and
a second localized input/output drive circuit configured to generate a second input/output drive signal in response to the process and temperature variation digital compensation signal and the digital compensation signal.

17. The integrated circuit of claim 12, further comprising:
a serializer circuit coupled to the operating condition compensation circuit and configured to serialize an operating condition compensation code generated by the operating condition compensation circuit; and
a de-serializer circuit coupled to the serializer circuit and coupled to the localized input/output drive circuit and configured to de-serialize the operating condition compensation code generated by the operating condition compensation circuit.

18. A system, comprising:
a first integrated circuit, including:
an operating condition compensation circuit configured to generate a process and temperature variation digital compensation signal corresponding to at least one operating condition on the integrated circuit;
a localized voltage compensation circuit configured to generate a voltage variation digital compensation signal as a function of a measured difference between a supply voltage at a localized area of the first integrated circuit and a fixed reference voltage; and
a localized input/output drive circuit configured to generate an input/output drive signal in response to the process and temperature variation digital compensation signal and the voltage variation digital compensation signal; and
a second integrated circuit coupled to the first integrated circuit.

19. The system of claim 18, wherein one of the first and second integrated circuits comprises a processor.

20. The system of claim 18, wherein one of the first and second integrated circuits comprises a memory.

21. A method, comprising:
sensing a global process and temperature variation operating condition in an integrated circuit that affects the operation of the integrated circuit;
generating a process and temperature compensation signal in response to the sensed global process and temperature variation operating condition;
sensing a local voltage variation operating condition that affects the operation of at least one localized circuit within the integrated circuit by measuring a difference between a supply voltage for the localized circuit and a fixed reference voltage;
generating a voltage compensation signal in response to the sensed local voltage variation operating condition; and
altering operation of said at least one localized circuit with the process and temperature compensation signal and the voltage compensation signal.

22. The method of claim 21, wherein the compensation signals comprise multi-bit digital code signals.

23. The method of claim 21, further comprising:
serializing the compensation signals;
communicating the serialized compensation signals via a serial bus to the at least one localized circuit; and
deserializing the serialized compensation signals at each localized circuit.

24. A method, comprising:
sensing a global process and temperature variation operating condition in an integrated circuit and generating a global process and temperature compensation signal;
sensing a plurality of localized voltage variation operating conditions in corresponding localized circuits within said integrated circuit and generating a local voltage compensation signal for each localized circuit, wherein each localized voltage operating condition is generated as a function of a measured difference between a supply voltage for the localized circuit and a fixed bandgap reference voltage for the integrated circuit; and
altering operation of at least one local input/output circuit of the integrated circuit in response to the global process and temperature compensation signal and in response to the local voltage compensation signal.

* * * * *